United States Patent [19]

Park

[11] Patent Number: 5,128,895
[45] Date of Patent: Jul. 7, 1992

[54] METHOD FOR PROGRAMMING A VIRTUAL GROUND EPROM CELL INCLUDING SLOW RAMPING OF THE COLUMN LINE VOLTAGE

[75] Inventor: Chin S. Park, Sunnyvale, Calif.

[73] Assignee: Intel Corporation, Santa Clara, Calif.

[21] Appl. No.: 658,184

[22] Filed: Feb. 20, 1991

Related U.S. Application Data

[62] Division of Ser. No. 439,694, Nov. 21, 1989, Pat. No. 5,027,321.

[51] Int. Cl.$^5$ .................. G11C 16/04; G11C 16/06
[52] U.S. Cl. .................. 365/185; 365/189.09; 365/104; 365/226
[58] Field of Search ............ 365/185, 230.06, 189.01, 365/189.09, 194, 184, 104, 226

[56] References Cited

U.S. PATENT DOCUMENTS

| | | | |
|---|---|---|---|
| 4,628,487 | 12/1986 | Smayling | 365/185 |
| 4,639,893 | 1/1987 | Eitan | 365/185 |
| 4,685,083 | 8/1987 | Leuschner | 365/185 |
| 4,722,075 | 1/1988 | Kaszubinski et al. | 365/226 |
| 4,723,225 | 2/1988 | Kaszubinski et al. | 365/185 |
| 4,868,790 | 9/1989 | Wilmoth et al. | 365/185 |
| 4,992,980 | 2/1991 | Park et al. | 365/185 |

Primary Examiner—Glenn Gossage
Attorney, Agent, or Firm—Blakely, Sokoloff, Taylor & Zafman

[57] ABSTRACT

An improved method for programming a selected memory cell in a virtual ground EPROM array avoids the disturbance of data stored in adjacent memory cells. To avoid disturbance of adjacent cells during programming, the array is efficiently debiased utilizing inter-column passgates along with slow ramping of the selected column line voltage. The method avoids the disturbance of data stored in adjacent memory cells by first selecting a row line coupled to the selected memory cell and the memory cells adjacent to it. Next, column lines coupled to the source and drain regions of memory cells on one side of the selected memory cell and column lines coupled to the source and drain regions of memory cells on the other side of the selected memory cell are coupled to first and second nodes respectively. The first node is coupled to ground. The potential on the second node is raised at a predetermined rate causing electrons to tunnel onto the floating gate of the selected memory cell, yet in such a manner that the potential across each of the first and second column lines on the other side of the selected memory cell does not disturb the programming state of the adjacent cells.

4 Claims, 4 Drawing Sheets

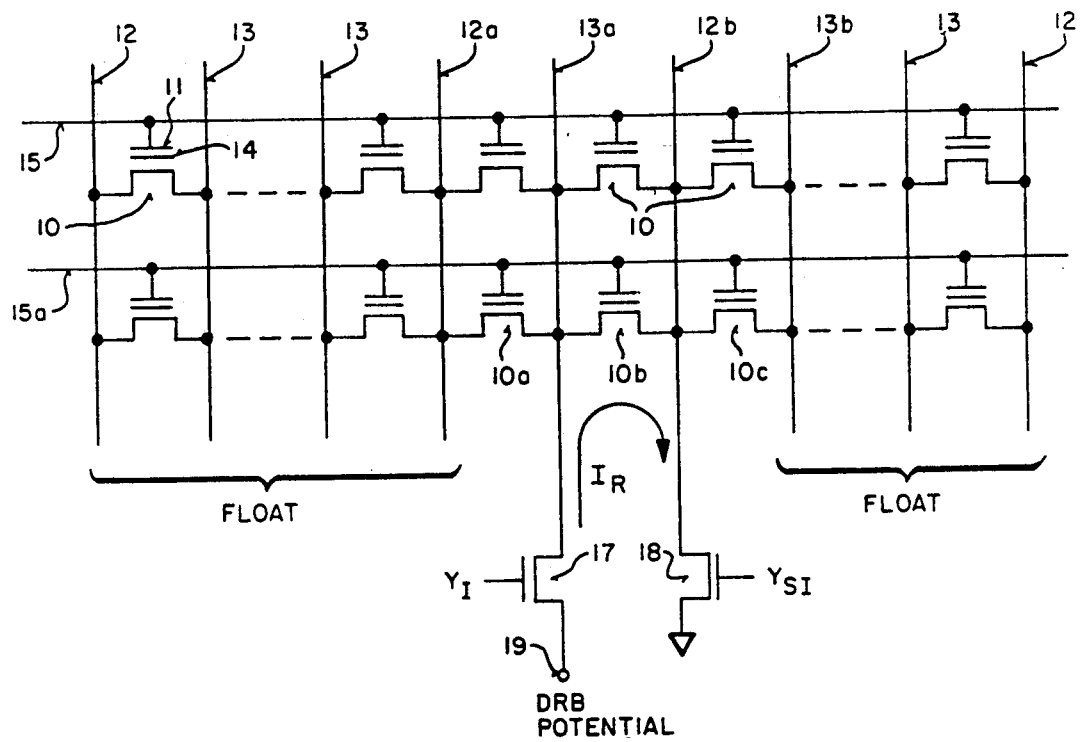
FIG_1 (PRIOR ART)
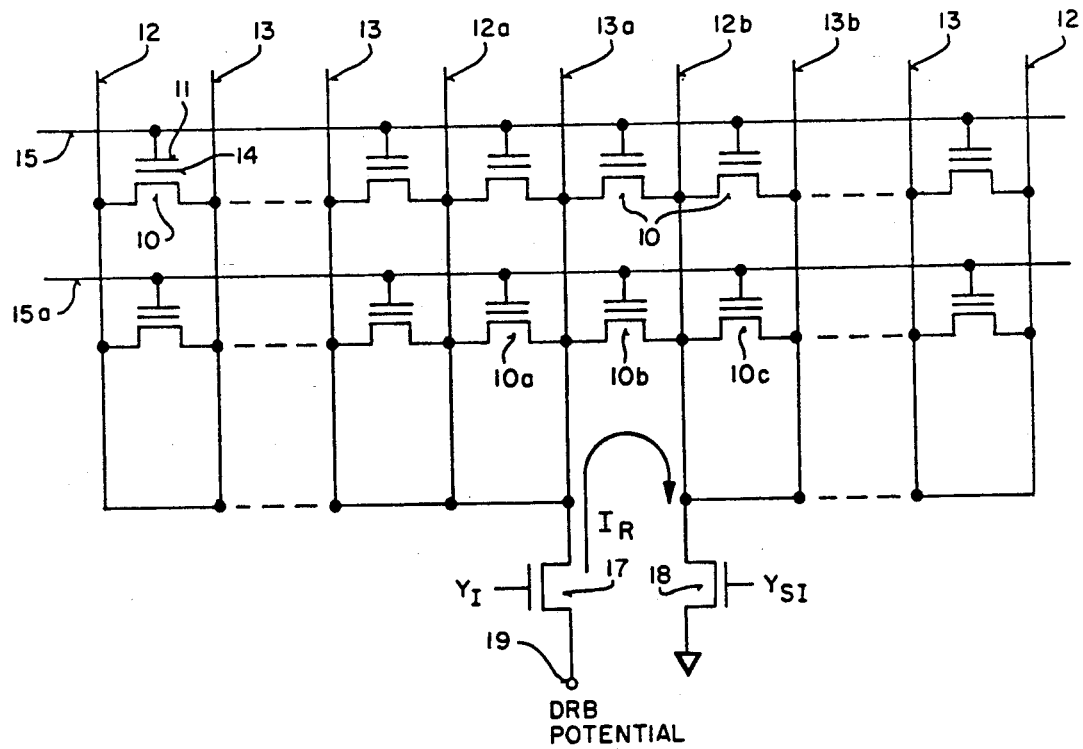
FIG_2 (PRIOR ART)

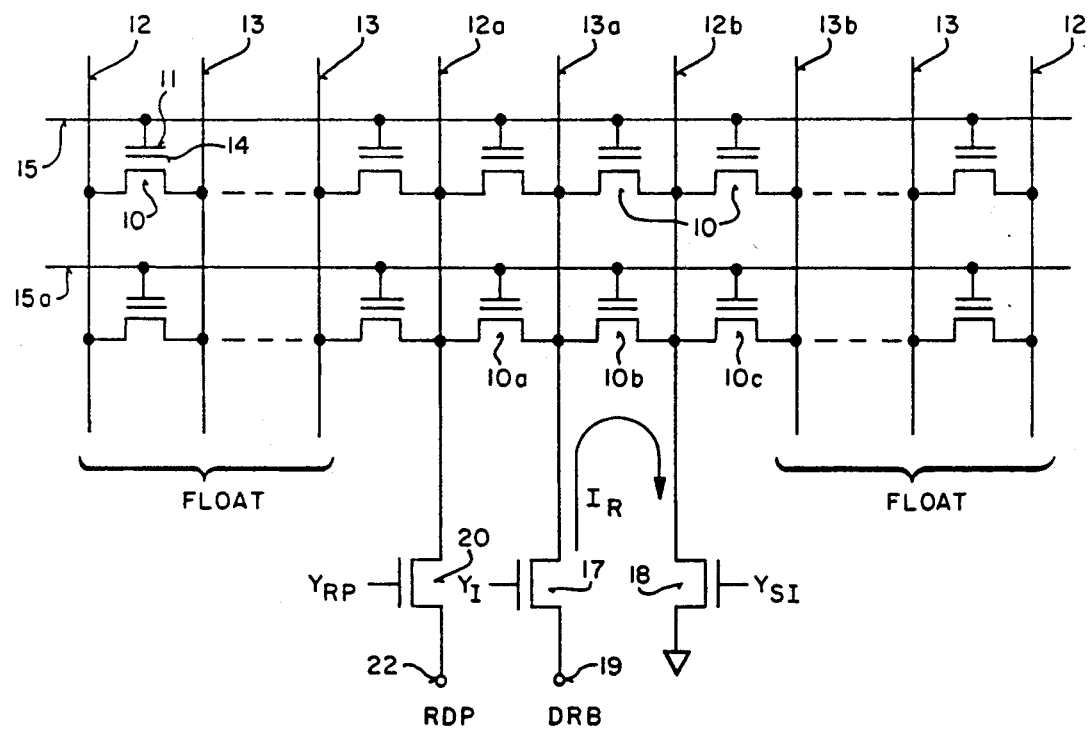

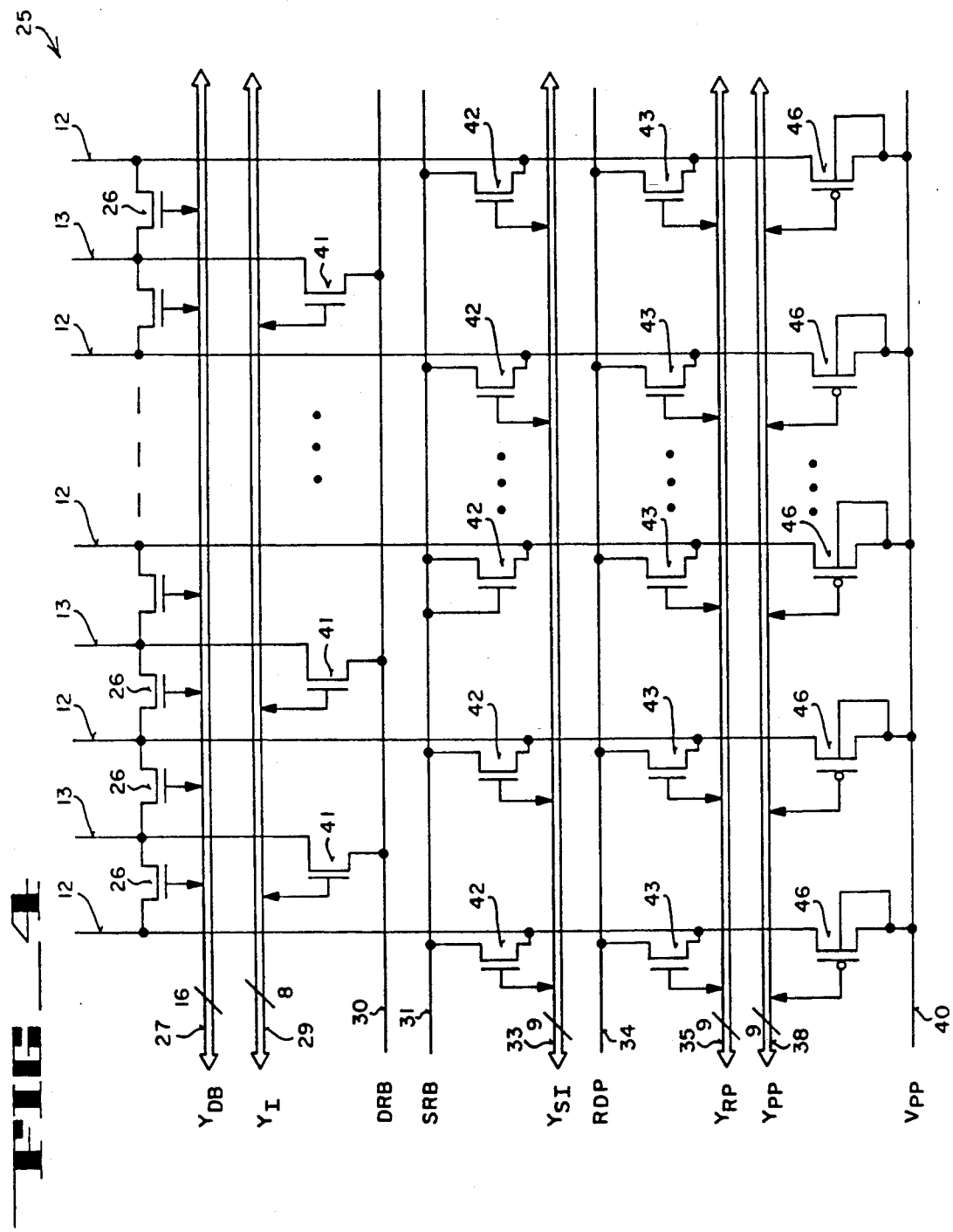

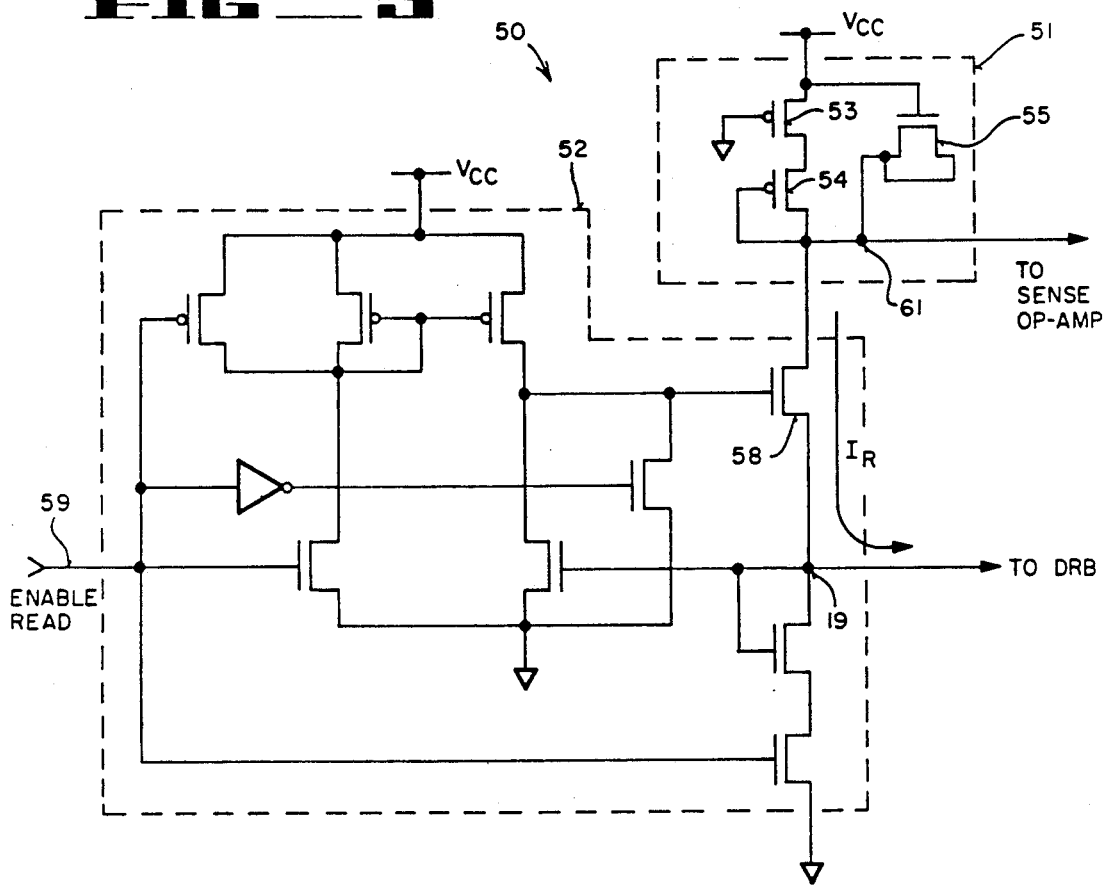
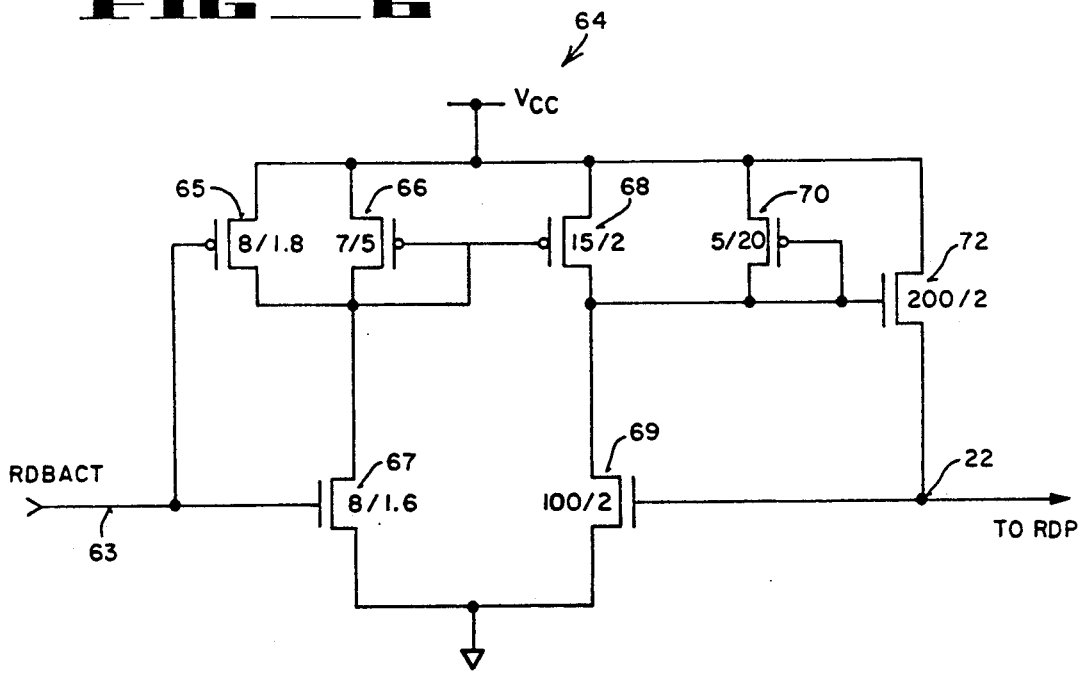

METHOD FOR PROGRAMMING A VIRTUAL GROUND EPROM CELL INCLUDING SLOW RAMPING OF THE COLUMN LINE VOLTAGE

This is a divisional application Ser. No. 07/439,694, filed Nov. 21, 1989 now U.S. Pat. No. 5,027,321.

FIELD OF THE INVENTION

This invention relates to the field of semiconductor memory devices. More specifically the invention relates to metal-oxide-semiconductor (MOS) read-only devices of the electrically programmable type.

BACKGROUND OF THE INVENTION

The continuing demand for higher speed and lower cost semiconductor memories has led to the development of the virtual ground configuration for read-only type memories. Virtual ground memories are a well-known technique for increasing the array density while at the same time maintaining process compatibility with existing double-level polysilicon n-channel processes. Representative examples of virtual ground memory arrays are disclosed in U.S. Pat. Nos. 3,916,169; 3,934,233; 4,021,781 and 4,387,447. A process for fabricating contactless electrically programmable and electrically erasable memory cells (EPROMs) of the flash variety for use in a virtual ground array is disclosed in U.S. Pat. No. 4,780,424 of Holler et al., which is assigned to the assignee of the present application. The contactless cells of Holler et al., use elongated source and drain regions disposed beneath field oxide regions. The drain regions are shallow compared to the source regions, while the source regions are characterized more by a graded junction.

While virtual ground memories do enjoy an advantage from the perspective of increased bit density, they are not without their disadvantages. One possible drawback of a contactless EPROM array and of virtual ground memory arrays in general, is the problem of unwanted interaction between adjacent cells. This interference is usually manifested as a program disturb condition, (i.e., unwanted programming of an unselected adjacent cell), or as read access degradation due to an unwanted current component. In both situations the interference is to the electrically programmable read-only memory cell located in the adjacent column and connected to the selected word line. Interaction between adjacent cells also leads to the formation of parasitic currents which interfere with reading, erasing and programming of individual cells. Ultimately, the access speed and the integrity of the memory array is adversely affected by these problems.

To overcome the drawbacks associated with prior art virtual ground architectures, the present invention provides an apparatus and method for eliminating parasitic currents during read mode operations in a virtual ground EPROM memory array. Importantly, the present invention achieves this result without sacrificing data access speed. The invention utilizes an additional voltage source to establish a read bias potential along the adjacent bit line (adjacent to the cell selected). This effectively shields possible interference from adjacent columns and speeds up the charging or discharging of the selected column.

Additionally, the present invention employes a debiasing scheme which uses intercolumn pass gates along with a slow ramping of the selected column voltage to avoid disturbance of adjacent cells during programming.

SUMMARY OF THE INVENTION

An electrically programmable memory device of the type having an array of rows and columns of memory cells made up of floating gate field-effect transistors is disclosed. Each transistor includes a floating gate, a control electrode, a drain and a source.

According to one embodiment of the present invention, a memor cell within the arry is accessed so as to avoid parasitic current flow in adjacent cells by first selected the row line coupled to the control electrode of the cell. Next, a first column line coupled to the source of the cell is grounded. Simultaneously, a first potential is applied to a second column line while a second potential is applied to a third column line. The second column line is coupled to the drain of the cell and the third column line is coupled to the drain of the adjacent cell, i.e., the cell in which parasitic current flow is to be prevented. The first potential conditionally flows a read current through the selected cell. The value of this conditional current is, of course, indicative of the content of the memory cell.

In another embodiment, a method is provided to avoid programming disturbance with adjacent cells in a floating gate memory array including a plurality of row lines, the control gate electrode of all cells in each row being coupled to a row line, and alternate first and second column lines. The first and second regions of all cells in each column are coupled to the first and second column lines respectively.

The method for avoiding disturbance of adjacent cells during programming comprises the steps of applying a first potential to the row line coupled to a selected cell to be programmed and also to the adjacent cells within that row. Next, all of the first and second column line on one side of the selected cell are coupled to a first node. All of the first and second column lines on the other side of the selected cell are coupled to a second node. Then, the first node is grounded while the potential on the second node is raised at a predetermined rate to a second potential. This causes tunnell predetermined rate to a second potential. This causes tunnel electrons onto the floating gate of the programmed cell. Significantly, the predetermined rate is controlled so that the potential across each of the first and second colum lines on the other side of the selected cell is insufficient to disturb the programming state of all those adjacent cells.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein;

FIG. 1 is an electrical schematic of a portion of art EPROM array utilizing floating gate transistors. FIG. 1 also illustrates a conventional method of accessing information stored in individual cells.

FIG. 2 is an electrical diagram of a portion of a prior art EPROM array utilizing floating gate transistors. FIG. 2 illustrates a different method of accessing information from an individual cell.

FIG. 3 is an electrical diagram of a portion of an EPROM memory array in which information from a cell is accessed according to the method of the present invention.

FIG. 4 is an electrical schematic of the Y-decoder circuitry associated with the currently preferred embodiment of the present invention.

FIG. 5 is an electrical diagram of the read-drain bias circuitry used during reading operations according to the currently preferred embodiment of the present invention.

FIG. 6 is an electrical schematic of the currently preferred embodiment of the RDP read-drain bias circuitry.

DISCUSSION OF THE PRIOR ART

Referring to FIG. 1, a portion of a prior art EPROM memory array is shown. Also illustrated is a conventional method for reading data from an individual cell. The memory array of FIG. 1 comprises a plurality of floating gate memory devices 10, each having a floating gate 14, a control gate 11 and source and drain electrodes coupled to column lines 12 and 13, respectively. Usually, columns 12 and 13 comprise buried bit lines which are fabricated as part of the source and drain regions of floating gate transistors 10 within a single column.

As is well understood by pratitioners in the art, during read operations, electrode 12 may act as the drain of the device while electrode 13 may act as the source. During write operations this situation is reversed—with electrode 13 funtioning as the drain and electrode 12 functioning as the source. (To avoid confusion, this application will universally refer to electrodes 12 and 13 as the source and drain respectively; the actual function of each for a specific operation being understood.) As is shown in FIG. 1, all of the control gates 11 within a single row are coupled to row line 15, also referred to as a word line.

To better appreciate the problems associated with read operations in the array of FIG. 1, consider the following example. Assume that the user wants to read the contents of memory cell 10b. Typically, source line 12b is grounded through transistor 18 while word line 15a is raised to a high positive potential. The associated drain line 13a, is coupled through transistor 17 to a read-drain bais potential supplied at node 19. This read-drain bias potential is labelled DRB in FIG. 1. The application of the DRB potential, which is commonly on the order of 1-2 volts, to drain line 13a causes a read current $I_R$ to flow through transistor cell 10b. The content of memory cell 10b is determined directly from the magnitude of current $I_R$.

The problem that exists with the method shown in FIG. 1 is that if the adjacent memory cell 10a has its associated source column line 12a at a potential which is different than the DRB potential, a parasitic current can flow through transistor 10a. This parasitic current interferes with the current $I_R$ so as to cause an error during reading of cell 10b. Most often, the DRB potential is approximately 1.2 volts. If the potential on line 12a is less than 1.2 volts, a portion of the read current $I_R$ will be diverted through adjacent cell 10a. To circumvent this problem in the past, the adjacent column lines in the memory array have been left floating, as shown in FIG. 1. Floating of the adjacent bit lines within the EPROM memory array, however, does not completely alleviate the presence of the interfering parasitic currents during read mode operations.

Another scheme which as been used in the past to avoid the problem of parasitic currents during read mode, is illustrated in FIG. 2. Instead of floating the adjacent column lines within the array, all column lines one one side of cell 10b are grounded, and all column lines on the other side of cell 10b are coupled to the DRB potential. By way of example, the source bit line 12b, together with all of the other bit lines to the right of line 12b (e.g., lines 13b, 12c, 13c, etc.), are grounded through transistor 18. Similarly, all of the bit lines to the left of transistor 10b (e.g., line 12a, etc.) are couopled to node 19 through transistor 17. While this scheme effectively eliminates parasitic current flow through adjacent transistor 10a, the large capacitance resulting from the connection of the additional bits lines to column line 13a give rise to long access times.

DESCRIPTION OF THE PREFERRED EMBODIMENT(S)

An apparatus and method for improving the reading/programming characteristics of a semiconductor memory array employing floating gate memory devices is disclosed. In the following description, numerous specific details are set forth, such as specific conductivity types, block sizes, voltages, etc., in order to provide a more thorough understanding of the present invention. It will be obvious, however, to one skilled in the art these specific details need not be used to practice the present invention. In other instances, other well-known structures and circuits have not been shown in detail in order to avoid unnecessarily obscuring the present invention.

READING OPERATIONS

With reference now to FIG. 3, the currently preferred method of the present invention is shown. The EPROM array of FIG. 3 includes an array of rows and columns of memory cells 10, each of which is an electrically programmable, insulated gate, n-channel field-effect transistor of a type well-known in the art. The control gate of each transistor 10 within a row is connected to a row line 15. The source region of each transistor with a column is coupled to bit line 12, while the corresponding drain region is coupled to bit line 13. In the preferred embodiment, column lines 12 and 13 comprise buried bit lines formed of elongated, parallel, spaced-apart diffusion regions.

To read the contents of cell 10b, word line 15a is first selected by raising it to a high positive potential. At the same time, source line 12b is ground through transistor 18. The remaining bit lines to the right of cell 10b (e.g., 13b, etc.) are left floating. Column line 13a is coupled to the read-drain bias potential provided at node 19 (labelled "DRB") through transistor 17. Instead of coupling adjacent column line 12a to the same DRB potentail provided on node 19, the method of FIG. 3 employs a separate read-drain bias potential (labelled "RDP")38 ) provided at node 22. Node 22 is coupled to adjacent bit line 12a through transistor 20. All of the other bit lines to the left of column 12a are left floating.

The read-drain bias potential RDP supplied at node 22 is identical in value to the DRB, potential provided at node 19, e.g., both are approximately 1.2 volts. Providing the same value of voltage insures that the read current is not diverted through transistor 10a and flows entirely through transistor 10b. Thus, the value of current $I_R$ accurately corresponds to the contents of bit 10b. As will be described shortly, the circuitry which supplies the RDP potential at node 22 is distinct from the circuitry which supplies the DRB potential at node 19.

Referring to FIG. 4, an electrical schematic of a Y-decoder 25 of the currently preferred embodiment of the present invention is shown having source bit lines 12 and drain bit lines 13 across which individual field-effect transistors 26 are coupled. The gates of each of the transistors 26 are tied to signal line $Y_{DB}$ along line 27. Lines 12 and 13, of course, comprise the column lines of the EPROM array illustrated in FIG. 3. Transistors 26 comprise intercolumn passgate transistors used for decoupling the various column lines during various programming operations. The function of transistors 26 will be described in more detail later.

Individual drain lines 13 end at the source of transistor 41, with the drain of transistor 41 being connected to the read-drain bias potential DRB along line 30. The gates of the individual transistors 41 are each coupled to bus 29, labelled "$Y_I$". In FIG. 4, decoder 25 is shown accommodating an array which is 8 lines wide. As such, bus 29 is 8-bits wide with each line being coupled to a separate gate of transistor 41. During a read operation an individual line of bus 29 is activated to couple a selected drain line 13 to the DRB potential.

In the same manner, each of the individual source lines 12 is coupled to one terminal of transistor 42—the other terminal being coupled to source read bias line 31, labelled "SRB". The gates of individual transistors 42 are each coupled to bus 33, labelled "$Y_{SI}$". Normally, line SRB 31 is coupled to ground potential during read operations with the appropriate $Y_{SI}$ line being raised to a high potential, thereby connecting a selected source line 12 to ground through transistor 42.

The secondary read drain bias potential RDP is provided in FIG. 4 along line 34, which is coupled to the source of field-effect transistors 43. The drain of each transistor 43 is coupled to individual source bit lines 12. The gates of transistor 43 are coupled along select line bus 35, labelled $Y_{RP}$. When the content of an individual memory cell is to be read, select lines $Y_{SI}$ and $Y_I$ couple the source and drain bit lines to ground and DRB potentials respectively. One line of the $Y_{RP}$ bus is used to select the source column line which lies immediately next to the drain line currently being coupled to the DRB potential. This selected source column line is coupled to the potential RDP on line 34. As stated, the RDP and DRB potentials are identical in value. However, each potential is supplied along a separate node by separate circuits.

Individual souce column lines are coupled through a respective p-channel field-effect transistor 46, to the supply potential $V_{PP}$ along line 40. The n-well associated with each p-channel transistor 46 is also coupled to $V_{PP}$ along line 40. The gate of each transistor 46 is coupled along bus 38, labelled "$Y_{PP}$". Transistors 46 are included for flash erase operations whereby the contents of the entire EPROM array may be erased simultaneouly. By way of example, to erase the memory array of FIG. 3, the supply potential $V_{PP}$ is coupled to the individual column lines 12 of the arrary by grounding the gates of transistors 46. At the same time, all of the word lines 15 within the array are grounded. This results in a flash erase of the entire array. Of course, numerous other methods of erasing the memory cells within the array also exist.

Referring now to FIG. 5, an electrical schematic of the read-drain bias circuitry which provides the DRB voltage during read operations is shown. The circuit of FIG. 5 may be considered as comprising two distinct blocks, 51 and 52. Circuit block 51 comprises p-channel field-effect transistors 53 and 54 and at least one n-channel field-effect transistor 55. Devices 53–55 are configured in such a way as to provide a measure of resistance to currend flowing from the supply potential $V_{CC}$ down through node 61. Block 52 functions as a simple switching device with feedback wherein the proper DRB potential of approximately 1.2 volts is developed at node 19 following a "low" to a "high" transition of the enable read input line 59.

When enable read input line 59 is taken high, block 52 is activated and current flows through transistor 58 to establish the proper voltage at node 19. The current flowing through device 58 creates a voltage drop across the resistance established by block 51. The value of this voltage drop is a function of the magnitude of the read current $I_R$. Thus, the voltage appearing at node 61 depends largely on the current $I_R$ and the resistance of block 51.

Node 61 is connected to a sense operational amplifier which is used to detect the magnitude of the voltage drop across block 51. This measure of voltage drop is used to determine the content of the memory cell currently being accessed. Consequently, greater sensitivity is achieved by making the resistance associated with block 51 relatively large. This large resistance, combined with the sizable capacitance of the selected drain bit line, iis the limiting factor determining access time in the EPROM memory array of FIG. 3.

Referring not to FIG. 6, an electrical schematic of the currently preferred embodiment of the read drain bias circuitry which supplies the RDP potential is shown. Circuit 64 comprises p-channel field-effect transistors 65, 66 68 and 70, and n-channel devices 67, 69 and 72. Basically, the function of circuit 64 is nearly identical to that of block 52 in circuit 50. That is, when the RDBACT input line 63 is raised to a high potential, circuit 64 is activated such that a RDP potential of approximately 1.2 volts is produced at node 22.

In circuit 61, transistors 66–69 form a current mirror between supply potential $V_{CC}$ and ground. Transistor 72 operates in a manner analogous to that of switching transistor 58 from circuit 50. Note, however, that the drain of transistor 72 is connected directly to the supply potential $V_{CC}$, and not to one node of a large impedance. Also note that the device size of transistor 72 is immensely large (i.e., 200/2, denoting the channel width/length dimensions in microns) to help in reducing the impedance at node 22. Obviously, a small inpedance on node 22 means that the adjacent bit line in the array (i.e., adjacent to the cell being accessed) can be raised to its read drain bias potential relatively quickly.

Furthermore, the fact that the DRB circuitry no longer has to drive the adjacent column lines (as was the case in certain prior art methods) allows for dramatic improvement in access time to the selected memory cell. Essentially, the present invention divides the normal read-drain bias potential voltage source into two separate sources—one dedicated to sensing the magnitude of the read current flowing through the selected cell, and the other dedicated to eliminating interference from adjacent cells due to parasitic current flow. The latter voltage source is designed to have a low output impedance to speed up access times within the array.

PROGRAMMING OPERATIONS

Conventionally, during programming of a EPROM memory cell the source is connected to ground, the drain is raised to approximately 7 volts and the control gate is raised to a programming potential or approximately 12 volts. The resulting high electric field produces hot electrons which are attracted to the floating gate member of the device.

The term "programming disturbance" refers to the fact that neighboring or adjacent cells along the same row may become inadvertently programmed to some degree. For instance, with the word line in a given row raised to a programming potential of 12 volts, the control gate of the cell immediately adjacent to the selected cell (i.e., the cell to be read) is also at the 12 volt potential. Because the adjacent cell also shares the drain line which is raised to a potential of approximately 7 volts, there exists the possibility that a high electric field may be generated across the channel of the adjacent cell. This causes the adjacent EPROM cell to become parasitically programmed. Obviously, if the source and drain lines of the adjacent cell can be maintained at about the same potential, parasitic programming can be averted. To avoid programming disturbance to adjacent cells in the same row line as the selected cell, the present invention employs a debiasing scheme which incorporates intercolumn pass gates along with slow ramping of the selected drain column line voltage.

There is shown in FIG. 4 a plurality of n-channel field-effect transistors 26 each having a control gate coupled to a sixteen bit bus 27, labelled $Y_{DB}$. Each of the transistors 26 is connected between a source bit line 12 and a drain bit line 13. During programming of a selected cell (e.g., cell 10b) within an array column, the source line 12 is first grounded through transistor 18 (see FIG. 3). All of the other source and drain column lines on that side of the array (i.e., lines 13b, etc. in FIG. 3) are also grounded by raising the potential of the control gates coupled to the intercolumn pass gate transistors 26 to the right of the selected cell. Thus, the ground potential connected to the source bit line 12 propagates through to the other column lines on that side of the array.

The same approach is sued to debias all of the column lines to the left of the selected memory cell. That is, the programming potential coupled to the drain column line 13a is allowed to propagate to all of the column lines to the left of the selected memory cell through intercolumn passgates 26 by raising the control gates of the transistors 26 on the left side of the selected cell to a high potential.

To summarize, when a selected memory cell is to be programmed, all of the column lines on the source side of the selected cell are grounded, while the all of the column lines on the drain side of the selected cell are coupled to the programming potential of approximately 7 volts. Debiasing in this manner effectively prevents a high electric field from developing across any adjacent cells. As previouslly mentioned, a high electric field across the source/drain terminals of an adjacent cell could easily result in unwanted parasitic programming in that cell.

Recognize that each transistor 26 has a certain resistance associated with its channel region and each column line has an associated capacitance. Consequently, it the programming potential applied to drain column line 13 is raised very quickly (i.e., a high ramping rate) a significant voltage difference may arise. Consider, by way of example, what would happen if line 13a in FIG. 3 were raised to the programming potential of 7 volts very rapidly. Because of the resistive and capacitive terms associated with the transistors 26 and column lines 12 and 13, respectively, the potential on the adjacent column line 12a would be delayed as compared to line 13a. Thus, the signal path assumes the properties of an ordinary transmission bus.

Due to the propagation delay of the programming potential, a voltage gradient is developed between adjacent column lines 13a and 12a. If the voltage differential is great enough, programming of the adjacent cell 10a will occur. Ideally, the voltage difference between two connected column lines of an unselected EPROM cell should be zero. In any event, it must be less than a certain limit—that limit being the maximum electric field strength which can be tolerated before programming takes place. To maintain this voltage difference below an acceptable limit, the programming potential applied to drain bias line 13 is raised at a controlled rate.

Experimentally, it has been shown that a ramp or slew rate of around 10 volts per microsecond or less is suitable to avoid program disturbance. Below this figure, the voltages along each of the connected column lines rise in near unison. In other words, below 10 volts per microsecond the voltage difference developed between any two adjacent column lines is generally insufficient to parasitically program that memory cell. It should be understood that the intercolumn passgates 26 could optionally be removed if parasitic programming is negligible or if speed is not critical.

Whereas many alternations and modifications of the present invention will no doubt become apparent to a person of ordinary skill in the art after having read the foregoing description, it is to be understood that the particular embodiments shown an described by way of illustration are in no way intended to be considered limiting. Therefore, reference to the details of the preferred embodiments are not intended to limit the scope of the claims which themselves recite only those features regarded as essential to the invention.

What is claimed is:

1. A method of programming a selected memory cell which avoids disturbance of data stored in adjacent cells, the selected memory cell being part of an electrically programmable semiconductor memory device having a plurality of floating gate memory cells arranged in rows and columns so as to form an array, each memory cell comprising a control gate and first and second regions having a conductivity type different from that of a substrate in which the first and second regions are formed; the memory device further including a plurality of row lines; the control gates of all memory cells in the same row being coupled to the same row line, and alternate first and second column lines, the first and second regions of all memory cells in the same column being coupled to corresponding first and second columnlines, respectively; said method comprising steps of:

applying a first potential to a row line coupled to said selected memory cell and said coupling all of the first and second column lines on one side of said selected memory cell to a first node;

coupling all of the first and second column lines on the other side of said selected memory cell to a second node;

grounding said first node;

raising the potential on said second node at a predetermined rate to a second potential to cause tunneling of electrons onto the floating gate of said selected memory cell, said predetermined rate being controlled such that a potential across each of the first and second lines on said other said of said selected memory cell is insufficient to disturb the data stored in said adjacent cells.

2. The method of claim 1, wherein said predetermined rate is less than or equal to 10 volts per microsecond 3. The method of claim 1, wherein said first potential is approximately 12 volts.

4. The method of claim 3, wherein said second potential is approximately 7 volts.

* * * * *

UNITED STATES PATENT AND TRADEMARK OFFICE
CERTIFICATE OF CORRECTION

PATENT NO. : 5,128,895
DATED : July 7, 1992
INVENTOR(S) : Chin S. Park

It is certified that error appears in the above-indentified patent and that said Letters Patent is hereby corrected as shown below:

Col. 1, line 66, delete "employes" insert --employs--.
Col. 2, line 11, delete "memor" insert --memory--.
Col. 2, line 38, delete "line" insert --lines--.
Col. 2, lines 43-44, delete "tunnell predetermined rate to a second potential. This causes tunnell electrons" insert --tunnelling of electrons--.
Col. 3, line 26, delete "pratitioners'" insert --practitioners--.
Col. 4, line 11, delete "couopled" insert --coupled--.
Col. 4, line 50, delete "ground" insert --grounded--.
Col. 4, line 57, delete "RDP)38)" insert --"RDP"--.
Col. 6, line 7, delete "currend" insert --current--.
Col. 6, line 30, delete "iis" insert --is--.
Col. 6, line 43, delete "61" insert --64--.
Col. 6, line 51-52, delete "inpedence" insert --impedance--.
Col. 7, line 3, delete "a" insert --an--.
Col. 7, line 6, delete "or" insert --of--.
Col. 7, line 45, delete "sued" insert --used--.
Col. 7, line 60, delete "previouslly" insert --previously--.

UNITED STATES PATENT AND TRADEMARK OFFICE
CERTIFICATE OF CORRECTION

PATENT NO. : 5,128,895
DATED : July 7, 1992
INVENTOR(S) : Chin S. Park

It is certified that error appears in the above-indentified patent and that said Letters Patent is hereby corrected as shown below:

Col. 7, line 66, delete "it" insert --if--.
Col. 8, line 54, delete ";" insert --,--.
Col. 8, line 59, delete "columnlines" insert --column lines--.
Col. 9, line 7, delete "said" (2nd occurrence) insert --side--.

Signed and Sealed this

Seventh Day of February, 1995

Attest:

BRUCE LEHMAN

*Attesting Officer*     *Commissioner of Patents and Trademarks*